(12) United States Patent  (10) Patent No.: US 8,145,959 B2
Mims et al.  (45) Date of Patent: Mar. 27, 2012

(54) SYSTEMS AND METHODS FOR MEASURING SOFT ERRORS AND SOFT ERROR RATES IN AN APPLICATION SPECIFIC INTEGRATED CIRCUIT

(75) Inventors: Marcus Mims, Fort Collins, CO (US); J. Ken Patterson, Fort Collins, CO (US); Ronald W. Kee, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 358 days.

(21) Appl. No.: 12/604,643

(22) Filed: Oct. 23, 2009

(65) Prior Publication Data

US 2011/0099440 A1  Apr. 28, 2011

(51) Int. Cl.
*G11C 29/00* (2006.01)

(52) U.S. Cl. ............... 714/718; 714/25; 714/30; 714/42; 714/48; 714/54; 714/719; 714/725; 714/726; 714/727; 714/729; 714/736; 365/201; 324/501; 324/762.02; 257/48

(58) Field of Classification Search .......................... None
See application file for complete search history.

(56) References Cited

U.S. PATENT DOCUMENTS

| | | | |
|---|---|---|---|
| 5,892,779 A | 4/1999 | Ohyama et al. | |
| 5,929,645 A * | 7/1999 | Aton | 324/754.21 |
| 6,055,656 A | 4/2000 | Wilson, Jr. et al. | |
| 6,971,051 B2 * | 11/2005 | Taylor et al. | 714/718 |
| 7,084,660 B1 * | 8/2006 | Ackaret et al. | 324/762.02 |
| 7,386,775 B2 * | 6/2008 | Birmiwal et al. | 714/729 |
| 7,617,430 B2 * | 11/2009 | Whetsel | 714/729 |
| 8,065,574 B1 * | 11/2011 | Cheng et al. | 714/725 |
| 2004/0003329 A1 | 1/2004 | Cote et al. | |
| 2004/0187050 A1 * | 9/2004 | Baumann et al. | 714/704 |
| 2004/0212388 A1 * | 10/2004 | Baumann | 324/765 |
| 2005/0138514 A1 * | 6/2005 | Burdine et al. | 714/733 |
| 2005/0186326 A1 * | 8/2005 | Baumann | 427/5 |
| 2006/0248419 A1 | 11/2006 | Colunga et al. | |
| 2007/0061644 A1 | 3/2007 | Birmiwal et al. | |
| 2009/0005955 A1 * | 1/2009 | Askew | 701/103 |
| 2010/0001738 A1 * | 1/2010 | Chang et al. | 324/501 |

* cited by examiner

*Primary Examiner* — John Trimmings

(57) ABSTRACT

A test system includes a computer and an interface device for accessing a scan chain on an application specific integrated circuit (ASIC) under test. The computer includes a memory that contains application software that when executed by the computer quantifies soft errors and soft error rates (SER) in storage elements on the ASIC. The interface device receives commands and data from the computer, translates the commands and data from a first protocol to a second protocol and communicates the commands and data in the second protocol to the ASIC. A method for measuring SER in the ASIC includes baseline, comparison, and latch up accesses of data in a scan chain in the ASIC. Between accesses, the ASIC is exposed to a neutron flux that accelerates the occurrence of soft errors due to ionizing radiation upon the ASIC.

20 Claims, 7 Drawing Sheets

SYSTEMS AND METHODS FOR MEASURING SOFT ERRORS AND SOFT ERROR RATES IN AN APPLICATION SPECIFIC INTEGRATED CIRCUIT

BACKGROUND

A soft error event in an integrated circuit is an unexpected change of a logical state of a storage element such as a flip flop, latch, shift register, or memory bit cell. Soft errors involve changes to data and are not indicative of a problem with the physical structure of the storage element itself. That is, if the desired data value is rewritten to the storage element after a soft error, the storage element will store the appropriate value.

Soft errors became widely known with the introduction of dynamic random-access memory (DRAM) in the 1970s. In these early memory devices, packaging materials contained small amounts of radioactive contaminants. Under some circumstances, radioactive emission from the contaminants in a housing or package caused a soft error in a semiconductor memory device contained within the housing. Package radioactive decay usually caused a soft error by alpha particle emission. The positively charged alpha particle traveled through the semiconductor to disturb the distribution of electrons in circuit elements. If the disturbance was large enough, a digital signal could change from a logic 0 value to a logic 1 value or vice versa. In combinational logic, this effect was transient, perhaps lasting a fraction of a nanosecond, and this transience has led to the challenge of soft errors in combinational logic mostly going unnoticed. In sequential logic such as latches and flops, and also in memory, this transient upset could become stored for an indefinite time, to be read out later. Thus, circuit designers were usually much more aware of the problem in storage devices.

Once the electronics industry had determined how to control package contaminants, it became clear that other causes were involved. It has been demonstrated that cosmic rays also cause soft errors. Although the primary particle of a cosmic ray does not generally reach the Earth's surface, it creates a shower of energetic secondary particles. At the Earth's surface approximately 95% of the particles capable of causing soft errors are energetic neutrons. This flux of energetic neutrons, which is actually a byproduct of cosmic rays, is typically referenced as "cosmic rays" in the soft error literature. Neutrons are uncharged and cannot disturb a circuit on their own, but undergo neutron capture by the nucleus of an atom in an integrated circuit. This process may result in the production of charged particles, such as alpha particles and other fragments, which can then cause soft errors.

Whether a storage element experiences a soft error depends on the energy of the incident particle, the geometry of the impact, the location of the strike, and the design of the storage element in its path. Storage element designs having higher capacitance and higher voltage differences between semiconductor junctions are less likely to suffer an error. However, pressures to increase storage capacity and data transfer rates lead to a decrease in the size of integrated circuit based storage elements and their operating voltages. These relatively smaller and faster storage elements present two problems with regard to incident ionizing radiation: 1) they are relatively more sensitive to the deposited charge, and 2) a given ionizing event is likely to affect more storage elements since more elements will intercept the path of the ionizing radiation. Consequently, the soft error rate (SER) becomes increasingly important as technology advances and feature size decreases. The SER is the rate at which a device or system encounters or is predicted to encounter soft errors. It is typically expressed as either a number of failures-in-time (FIT), or mean time between failures (MTBF).

Traditionally, SER characterization of storage element designs has been performed on integrated circuits constructed specifically for test purposes. Such dedicated SER test circuits are inherently expensive and wasteful to design and construct and ultimately only emulate what might occur on an actual application specific integrated circuit.

As integrated circuits (ICs), especially application-specific ICs (ASICs), have become increasingly complex, testing their functionality to ensure that they operate properly has become increasingly challenging. IC testing involves two general categories: functional testing and structural testing. Functional testing involves stimulating the primary inputs of the IC and measuring the results at the primary outputs of the integrated circuit. Functional testing exercises the functionality of logic elements within the IC and is a time-honored method of testing that the IC can perform its intended operations. However, creating a robust functional test for a complex IC is labor intensive, and attendant test equipment can be uneconomical.

To economize effort and cost involved in IC testing, structural testing has emerged as an alternative to functional testing. In a structural test, the internal storage elements of the IC are used to control and observe the IC internal logic. A structural test is generally done by linking the storage elements into a serial shift register or "scan chain" when a test mode signal is applied. This technique is commonly referenced as "scan testing." Generally, an IC having scan testing capability includes a number of scan chains, each comprising a number of interconnected multiplexers and registers connected to the functional logic of the integrated circuit. The registers in a scan chain are typically implemented using D flip-flops. A scan chain can be many hundreds of thousands of flip-flops in length, and is generally divided into a smaller number of shorter scan chains, each typically comprising on the order of one hundred to one thousand flip-flops and multiplexers.

During scan testing, scan data that is provided to the IC at an input/output (I/O) pad is serially clocked into, i.e., loaded into, the scan chain registers. After the scan data is loaded, a primary input state is applied to the combinational logic of the integrated circuit. The combination of the scanned-in present state and the applied primary inputs comprises the test stimulus. The values of the primary outputs are then measured and a single clock cycle is executed to capture the response of the circuit to the stimulus. To complete the scan test, the values captured in the registers are then serially scanned out of the scan chain to an I/O pad. Scan chains can be scanned out serially, i.e., one after another. Alternatively, multiple scan chains can be scanned out in parallel.

Another type of testing is known as boundary scan. Boundary scan is a method for testing interconnects between devices on printed circuit boards or between sub-blocks inside an IC. Boundary scan testing has been standardized by the Joint Test Action Group (JTAG) as IEEE Standard 1149.1. For purposes of board-level testing, a JTAG-enabled IC includes dedicated "test cells" connected to each I/O pad of the IC that can selectively override the functionality of that pad when instructed to enter a JTAG test mode. These cells can be programmed via the JTAG scan chain to drive a signal onto a pad and across an individual trace on a circuit board. The cell at the destination of the board trace can be programmed to read the value at the pad, verifying that the board trace properly connects the two pads. In the case of performing boundary scan testing between IC sub-blocks, test cells disposed between the sub-blocks allow the sub-blocks to be controlled in the same manner as if they were physically independent circuits. Scan tests are implemented to test integrated circuit behavior, such as hard errors caused by manufacturing defects in digital logic based devices. A hard error is permanent and the defective circuit must be avoided if the digital logic is to function as intended.

SUMMARY

An embodiment of a test system for quantifying soft errors in storage elements on an application specific integrated circuit (ASIC) includes a computer and an interface device. The computer includes a memory that contains application software that when executed by the computer quantifies soft errors in storage elements on the ASIC. The interface device includes an input port, a translator, and an output port. The input port receives commands and data from a standard output port of the computer. The translator modifies the commands and data from a first protocol to a second protocol. The output port of the interface device is coupled to a device under test that includes the ASIC. The output port of the interface device communicates the commands and data in the second protocol to the ASIC.

An embodiment of a method for measuring soft errors in an application specific integrated circuit (ASIC) includes the steps of accessing a scan chain on the ASIC by writing a first data pattern into a set of test control registers and writing a second data pattern into the individual storage elements of the scan chain, arranging the ASIC in registration with an emitter configured to direct a neutron flux in the direction of the ASIC, exposing the ASIC to the neutron flux to trigger a soft error in one or more storage elements within the scan chain, accessing the contents of the set of test control registers and comparing read data values to the first data pattern, when the comparing indicates that the read data values do not match the first data pattern, ignoring data from the individual storage elements of the scan chain, when the comparing indicates that read data values match the first data pattern, storing the contents of the individual storage elements of the scan chain in a first array while writing an alternating data pattern into the individual storage elements of the scan chain, accessing the contents of the set of control registers and comparing read data values to the first data pattern, when the comparing results in an indication that the read data values do not match the first data pattern, verifying a latch condition, when the comparing indicates that read data values match the first data pattern, storing the contents of the individual storage elements of the scan chain in a second array while writing a new baseline data pattern into the individual storage elements of the scan chain, comparing the second data pattern with the contents of the first array and comparing the alternating data pattern with the contents of the second array.

The figures and detailed description that follow are not exhaustive. The disclosed embodiments are illustrated and described to enable one of ordinary skill to make and use the systems and methods for measuring soft errors in an ASIC. Other embodiments, features and advantages of the systems and methods for measuring soft errors in an ASIC will be or will become apparent to those skilled in the art upon examination of the following figures and detailed description. All such additional embodiments, features and advantages are within the scope of the systems and methods as defined in the accompanying claims.

BRIEF DESCRIPTION OF THE FIGURES

The systems and methods for measuring soft errors in an ASIC can be better understood with reference to the following figures. The components within the figures are not necessarily to scale, emphasis instead being placed upon clearly illustrating the principles of observing and quantifying soft errors in an ASIC. Moreover, in the figures, like reference numerals designate corresponding parts throughout the different views.

DETAILED DESCRIPTION

Figure 1:
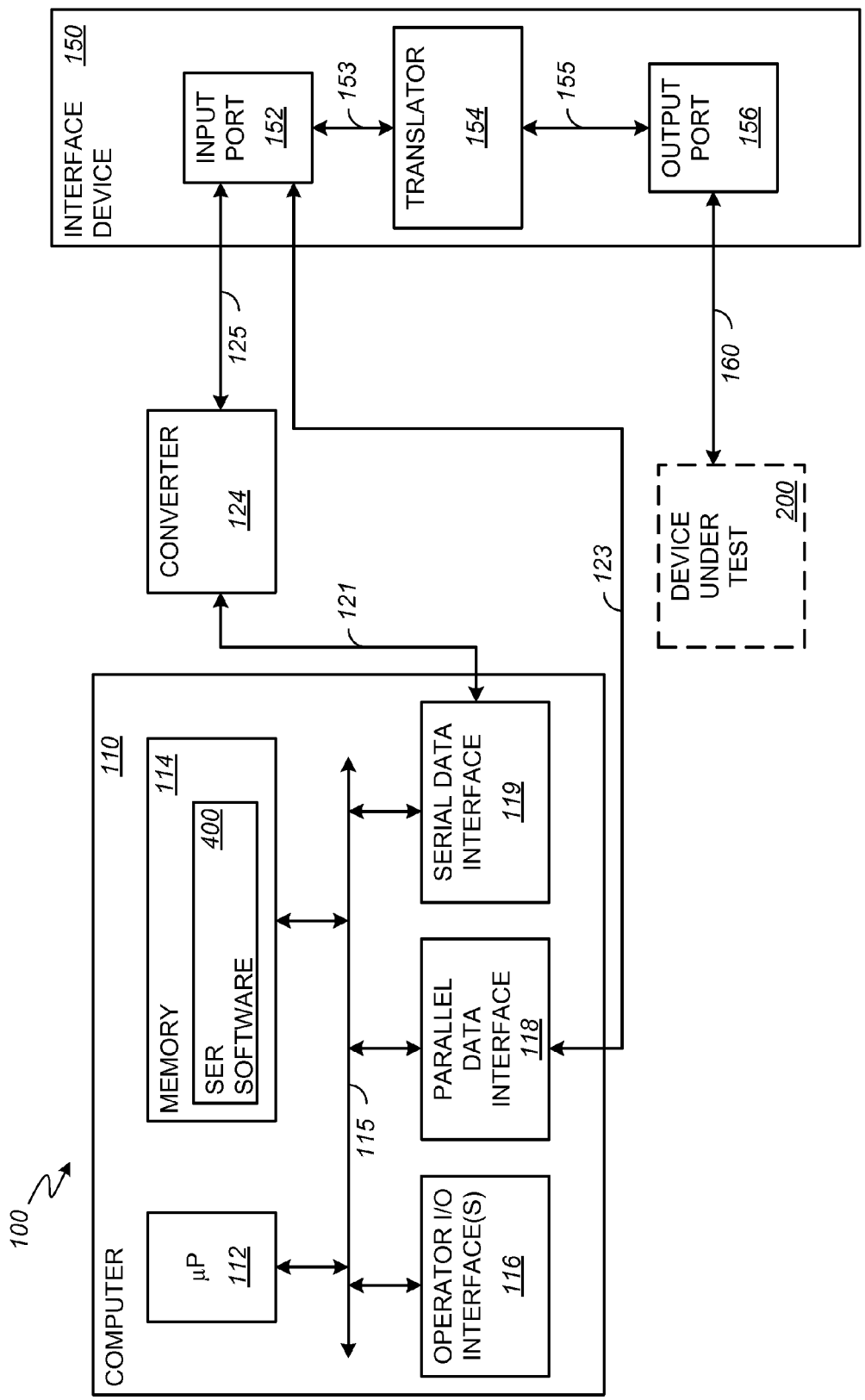
FIG. 1 is a functional block diagram of an embodiment of a test system for measuring SER for storage elements on a device under test.

A test system communicates with storage elements in an ASIC under test to identify and measure a soft error rate (SER) for various storage element designs. The test system includes a computer and an interface device that enables commands and data to be transferred between the computer and the ASIC under test. The computer includes SER software which, when executed by the computer, performs a series of steps to quantify SER for an ASIC product. The interface device permits the computer to communicate with data storage elements embedded on the ASIC. More specifically, the interface device enables two-way signal transfers between a standard input/output port on the computer and a test access port (TAP) on the ASIC that operates in accordance with the Standard Test Access Port and Boundary-Scan Architecture for test access ports (IEEE Std. 1149.1) used for testing printed circuit boards using boundary scan.

In an embodiment, the test system further includes an emitter and a controller. The emitter, which operates under the direction of the controller, directs ionizing radiation of a desired type and energy level at the ASIC under test. In an embodiment, the controller applies the ionizing radiation. That is, the computer and the controller are not coupled to one another. In an alternative embodiment, the controller is coupled to the computer and receives timing and other control information from the SER software in the computer.

The SER software takes advantage of a set of test control registers and the TAP to access (i.e., write select data to and/or read data from) a specified scan chain in the ASIC under test. A scan chain is a collection of serially coupled flip-flops connected to form a serial-shift register. The SER software identifies data errors in the set of test control registers. When such errors are encountered, data from the scan chain cannot be verified and is ignored. In addition to identifying data errors in the test control registers, the SER software identifies and counts the number of soft errors in the scan chain. The SER software further identifies errors due to potential latch up events in a particular flip-flop in the scan chain.

When executed by the computer, the SER software performs baseline, comparison, and latch up accesses of data in a scan chain in the ASIC. Each access is enabled by sending appropriate configuration information to the test control registers via the TAP.

During a first or baseline access operation, data is written to the test control registers and to a select scan chain. The data sent to the test control registers includes configuration information that instructs the TAP to permit access to an identified scan chain on the ASIC. Once the test control registers are configured, an initial array or data pattern is written to the identified scan chain.

Thereafter, during a dwell period, the ASIC is exposed to radiation at an intensity which will cause data corruption in the scan chain. The SER software is suspended for the duration of the dwell period. In alternative processes, the ASIC is exposed to ionizing radiation throughout the testing period. That is, the ionizing radiation is removed to enable access to test equipment or the ASIC under test. In these alternative processes, the ionizing radiation is applied and directed towards the ASIC under test during those times when the SER software performs initialization and access operations in addition to the dwell period.

Upon completion of the dwell period, the SER software performs a second or compare access operation. During the compare access operation, the data content within the test control registers is checked to ensure that an error has not been induced in the test control registers. The check is performed by comparing the configuration data that was previously written to the test control registers with read data from the test control registers. When an error is discovered in the test control registers, the SER software returns to the first or baseline access operation. Otherwise, when no error is identified in the test control registers, the SER software continues by shifting an alternating data pattern into the scan chain and storing the read data values into a first results array.

Thereafter, the SER software performs a latch up access operation. During the latch up access operation, the data content within the test control registers is checked to ensure that an error has not been induced in the test control registers. The check is performed by comparing the configuration data that was previously written to the test control registers with read data from the test control registers. When an error is discovered in the test control registers, the SER software performs additional tests to verify a potential latch condition. A latch-up condition occurs when either latch of a flip-flop holds or stores a logic value despite the logic value that is applied at its input. A latch is a circuit element within a flip-flop. When a latch-up condition occurs, each subsequent flip-flop will store the logic value held or stored in the flip-flop that failed. In an alternative embodiment, the SER software suspends and notifies a test operator to perform the additional steps to verify the latch-up condition. When an error is discovered in the test control registers, the SER software returns to the first or baseline access operation. Otherwise, when no error is identified in the test control registers, the SER software continues by shifting the original or baseline data pattern into the scan chain and storing the read data values into a second results array.

Next, the SER software compares the initial data pattern that was written to the scan chain with the contents of the first results array. The result of the comparison identifies the location(s) of particular flip-flop(s) where an error occurred in the scan chain. This is accomplished by writing an address associated with the flip-flop where the error occurred to a data file. In addition, the SER software is configured to increment a counter each time an error is identified in the data read from the scan chain. The SER software also compares the alternating data pattern that was written to the scan chain prior to the latch up access operation with the contents of the second results array. As part of the comparison process, the SER software identifies the number of errors that result from the comparison. When the number of errors exceeds a threshold value, the SER software notifies an operator to perform successive access operations to identify a latch up event in the scan chain. As part of the successive access operations, power to the ASIC under test may be turned off and turned back on to determine if the data value stored by the failed flip-flop can be corrected.

After the comparisons have been performed, the SER software returns to the dwell period where the ASIC under test is again exposed to incident radiation to cause scan chain data corruption. In one embodiment, the ASIC under test, the interface device and a power supply are placed in a test facility that exposes the ASIC to a flux of alpha or neutron particles. An example neutron test facility that can produce and control such ionizing radiation is commonly referred to by the acronym TRIUMF (i.e., TRI-University Meson Facility). The TRIUMF research facility is located on the University of British Columbia campus in Vancouver, British Columbia. In an alternative embodiment, the ASIC can be exposed on a bench test to alpha particles generated from an alpha particle source that is readily available from various scientific supply houses.

A minimum dwell time t or period of radiation exposure can be determined as a function of the number of errors N that are desired to occur during a test run, a flop SER neutron cross-section σ, a neutron flux f and the number of flops B in the scan chain susceptible to soft errors. The function is represented in Equation 1 below.

$$t = \frac{N}{\sigma f B} \qquad \text{Equation 1}$$

In an example, where the SER neutron cross section σ is estimated to be about $5\times10^{-14}$ cm$^2$/flop, the neutron flux f is estimated to be about $1.6\times10^5$ cm$^{-2}$s$^{-1}$, the number of errors desired to occur N is about 100, and the number of flops susceptible to soft errors B is about 814,000, the function indicates that an exposure time of about 4.27 hr will result in about 100 soft errors. Because radiation induced errors can occur in the test control registers at any time during the dwell exposure, rendering data from the scan chain unverifiable, the SER software is configured to perform M error collection cycles, where M is an integer, over a test run. For the above example, where M is the integer 4, a dwell time of 64 minutes will be applied. The shorter dwell time will result in a more efficient use of lab resources as a particular test run can be aborted upon an earlier detection of an error in the test control registers.

The test system and methods for measuring soft errors in an ASIC can be implemented in hardware, software, or a combination of hardware and software. When implemented using a combination of software and hardware, the test system and methods for measuring soft errors in an ASIC can be implemented using software or firmware and specialized hardware elements and logic. When the methods for measuring soft errors in an ASIC are implemented fully or partially in software, the software portion can be used to issue commands that enable data transfers to and from embedded memory elements on an ASIC. The software can be stored in a memory and executed by a suitable instruction execution system (microprocessor). The hardware implementation of the system and methods for measuring soft errors in an ASIC can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for measuring soft errors in an ASIC comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random-access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

Turning now to the drawings, wherein like reference numerals designate corresponding parts throughout the drawings, reference is made to FIG. 1 which illustrates a functional block diagram of an embodiment of a test system 100 for measuring SER for storage elements on a device under test 200. In the example embodiment, the test system 100 includes a computer 110 and an interface device 150 that couples the computer 110 to a device under test 200. In an alternative embodiment, the test system 100 can be implemented in an application specific test and measurement device that is configured to communicate directly with a TAP on an ASIC under test.

The computer 110 is a general-purpose computing device. In an embodiment, the computer 110 is implemented in a laptop form factor such as a Compaq model 8510p available commercially from the Hewlett-Packard Company of Palo Alto, Calif., U.S.A. As illustrated, the computer 110 includes a microprocessor or processor 112, a memory 114, operator input/output interface(s) 116, an optional parallel data interface 118 and a serial data interface 119 that are coupled to one another via a local interface 115.

The local interface 115 can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, power and/or data connections to enable appropriate communications among the aforementioned components.

The processor 112 executes software stored in the memory 114 in accordance with commands and data received via the operator I/O interfaces 116, and the data interfaces. The memory 114 includes SER software 400 that when executed by the processor 112 sends appropriate data and commands via the interface device 150 and a TAP to memory elements embedded on an ASIC under test. In the illustrated embodiment, the device under test 200 is a printed circuit board that includes an instance of a production ASIC that is designated for sale to a customer.

The operator I/O interface(s) 116 include logic and buffers to enable an operator to communicate with the computer 110 using one or more of a keyboard, a speaker, a microphone, a display, a touch-sensitive display, a multiple-function pointing and selection device such as a mouse, etc.

The optional parallel data interface 118 is an output port or physical interface through which data bits are grouped and communicated together (i.e., substantially simultaneously with each other). Although parallel data interfaces provided on computers have been historically used for one-way communication from the computer 110 to a printer, with some modifications, the computer 110 can be configured to enable two-way data transfers through a parallel data interface 118. In the illustrated embodiment, the optional parallel data interface 118 is coupled to the interface device 150 by connection 123.

The serial data interface 119 is an output port or physical interface through which information transfers in or out one bit at a time. Commercially available laptop computers such as the Compaq model 8510q include multiple serial data interfaces implemented using the Universal Serial Bus (USB). The USB provides a mechanism for enabling two-way communication between the computer 110 and a peripheral device such as the interface device 150. The optional parallel data interface 118 provides an alternative mechanism for enabling two-way communication between the computer 110 and the interface device 150.

Figure 3:
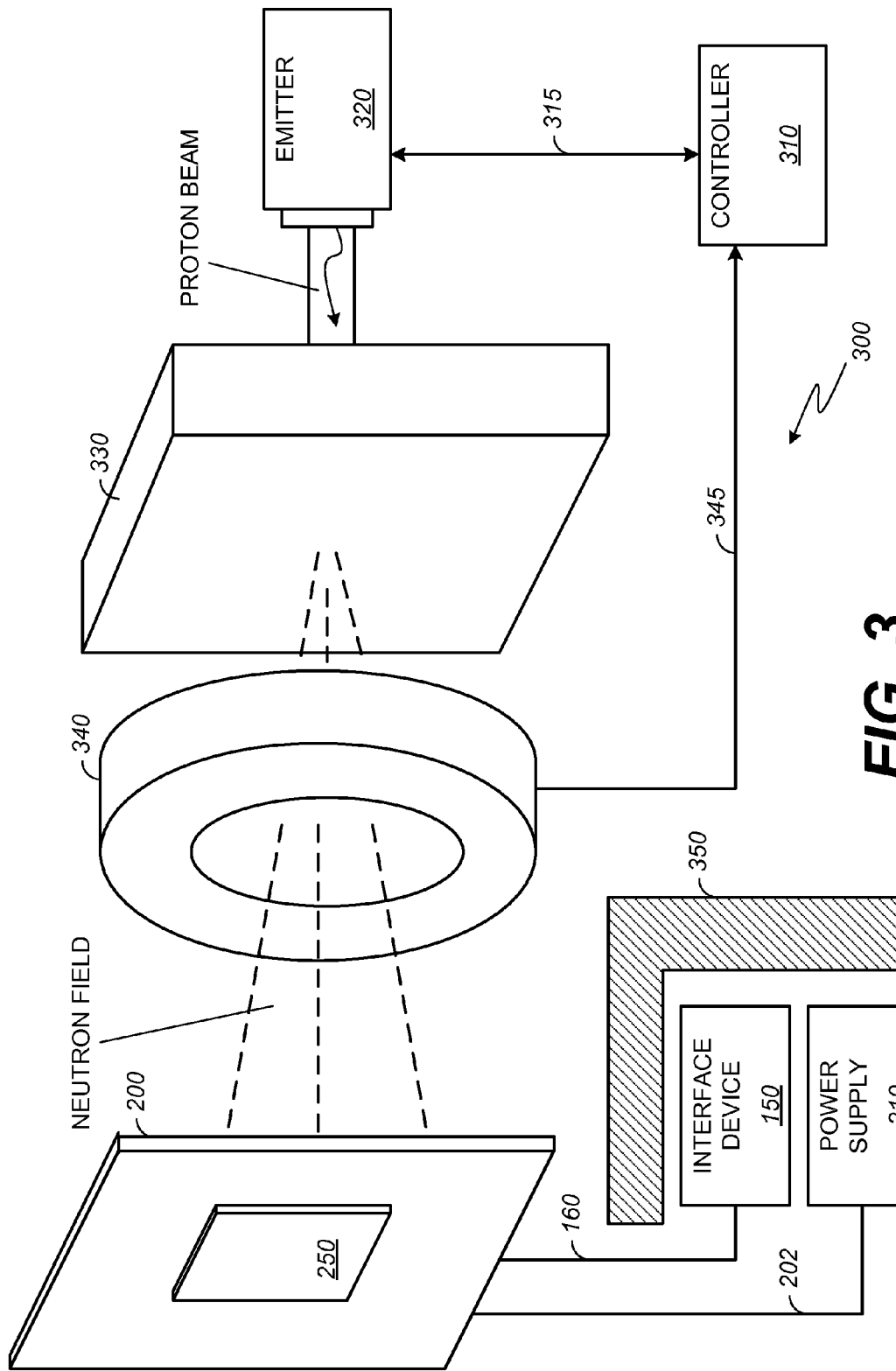
FIG. 3 is a schematic diagram illustrating an embodiment of a test environment suitable for performing a SER test on the device under test of FIG. 1.

However, the present test system 100, as will be explained in association with the embodiment illustrated in FIG. 3, is designated for operation in an environment exposed to ionizing radiation to accelerate the occurrence of soft errors in memory elements on an ASIC under test. For operator safety and data integrity on the computer 110, a converter 124, which is coupled to the computer 110 via a USB cable 121, is introduced between the computer 110 and the interface device 150. In an example embodiment, the converter 124 converts USB compatible signals from the serial data interface 119 for transmission along an ANSI/TIA/EIA-568-A/B compliant (e.g., a CAT5 or CAT5e) cable 125 to the interface device 150. The converter 124 extends the distance over which the computer 110 can communicate with the interface device 150. In an example embodiment, the cable 125 has a length of about 100 feet. The combination of a barrier constructed of a dense material and the extended distance provided by the converter 124 and cable 125 reduces the probability of soft errors occurring within the computer 110 due to ionizing radiation emitted from a test source. This same combination further prevents unnecessary operator exposure to the ionizing radiation.

The interface device 150 receives commands and data in a first communication protocol from the computer 110. The received commands and data are converted within the interface device 150 from the first communication protocol to a second communication protocol. The interface device 150 includes an input port 152, a translator 154 and an output port 156. The input port 152 is connected to the translator 154 by connection 153. The translator 154 is connected to the output port 156 by connection 155. The input port 152 and the output port 156 may include buffers (caches), drivers, repeaters, and receivers, to enable communications. The output port 156 is used to communicate commands and data on connection 160 to the device under test 200.

In an embodiment, the translator 154 is configured to convert commands and data received in accordance with the USB communication protocol or standard to the Standard Test Access Port and Boundary-Scan Architecture for test access ports used for testing printed circuit boards using boundary scan (or I.E.E.E. 1149.1). Consequently, the interface device 150 is well suited for communicating and programming ASIC-based embedded systems. Example interface devices that convert USB compliant command and data signals to I.E.E.E. 1149.1 compliant signals are available commercially from numerous manufacturers.

In alternative embodiments, the interface device 150 could receive commands and data in accordance with other serial data transfer protocols (e.g., the RS-232 communication standard) or a modified parallel data transfer protocol. In these alternative embodiments, the translation or conversion of the received commands and data are communicated to the device under test 200 in accordance with the I.E.E.E. 1149.1 standard. Example interface devices that convert RS-232 compliant and/or parallel port compliant command and data signals to I.E.E.E. 1149.1 compliant signals are also available commercially from numerous manufacturers.

Figure 2:
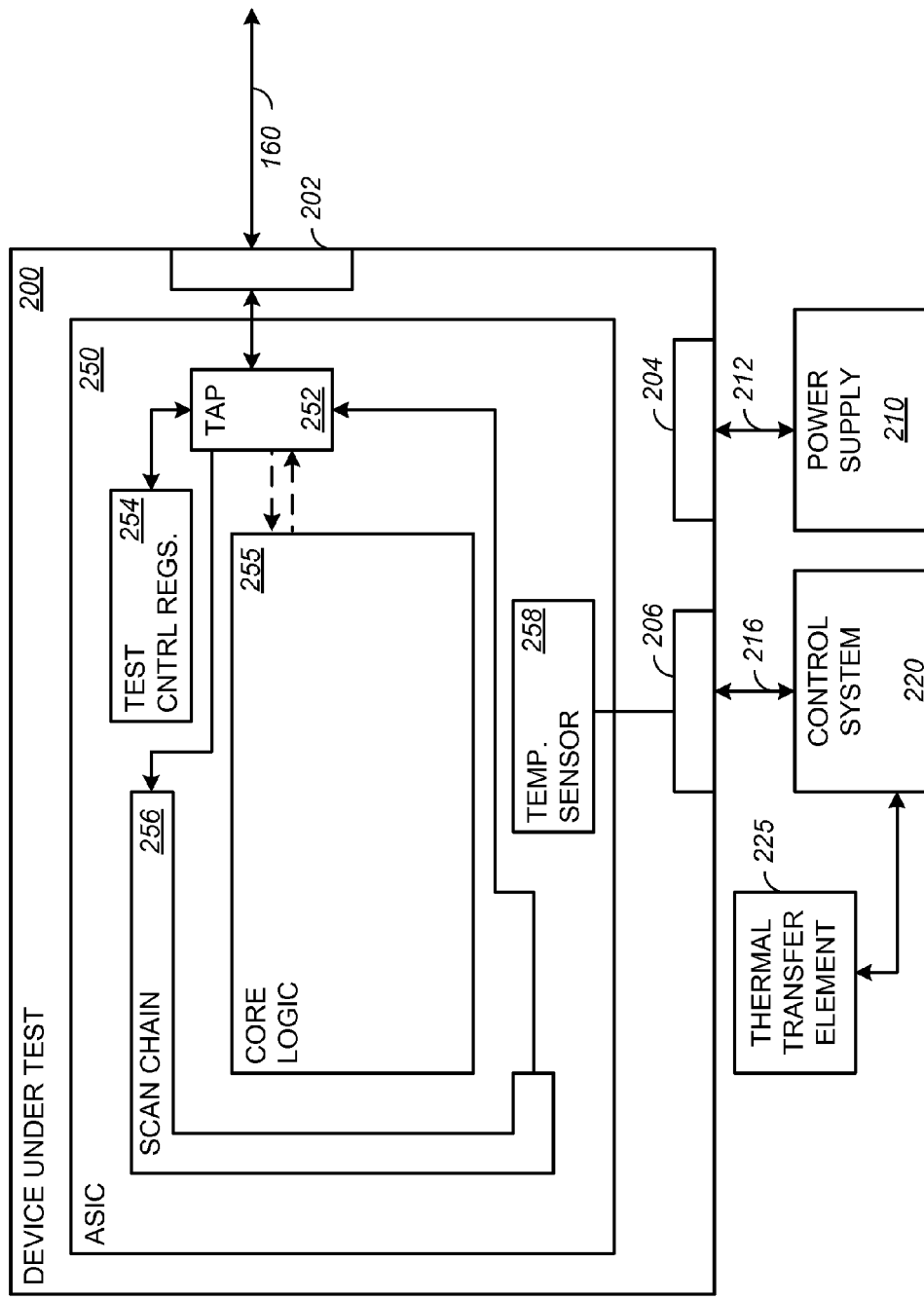
FIG. 2 is functional block diagram illustrating an embodiment of the device under test of FIG. 1.

FIG. 2 is functional block diagram illustrating an embodiment of the device under test 200 of FIG. 1. The device under test 200 is a printed circuit board configured with an ASIC 250. The device under test 200 further includes a connector 202, a connector 204, and a connector 206. The connector 202 receives commands and data from the interface device 150 along connection 160. The connector 202 is coupled to signal traces which provide the commands and data to the TAP 252 on the ASIC 250. The TAP 252 is configured to communicate serially based on a technique specified in the IEEE 1149.1 standard. The connector 204 receives one or more regulated supply voltages along connection 212 from an adjustable power supply 210. The connector 204 is coupled to appropriately arranged supply and ground buses to distribute power to the ASIC 250. Adjustment of one or more of the supply voltage(s) provided by the power supply 210 to the ASIC 250 may be made via closed loop control when the power supply 210 is coupled to the computer 110. Alternatively, adjustment of supply voltage(s) can be performed by a test operator and one or more control inputs on the power supply 210.

The connector 206 receives one or more signals from a temperature sensor 258 arranged on the device under test 200 and forwards the signals to a control system 220. In the illustrated embodiment, the temperature sensor 258 is integrated on the ASIC 250. In alternative embodiments, a temperature sensor may be arranged on the surface of a package that encapsulates the ASIC 250 or in close proximity to the ASIC 250. Adjustment of an ASIC core temperature or an ASIC case or housing sensed temperature may be made via closed loop control when the control system 220 is coupled to the computer 110 and to an appropriately configured thermal transfer device 225 (e.g., a heater or a cooler). Alternatively, adjustment of an ASIC core temperature or an ASIC case or housing sensed temperature can be performed by a test operator and one or more control inputs on the control system 220.

Although the device under test or printed circuit board is shown with separate dedicated connectors, the various connections with external systems, supplies and communication interfaces can be made through any combination of one or more connectors coupled to appropriately arranged signal traces on the printed circuit board.

In addition to the TAP 252, the ASIC 250 includes a set of test control registers 254 and core logic 255. The set of test control registers 254 receive configuration information in the form of commands and data. The set of test control registers 254 are accessed via the TAP 252. The configuration information is used to access memory elements within the core logic 255 and to set and arrange accessible flops into a serial-shift register commonly called a scan chain. Once the scan chain 256 is defined, the TAP 252 can be used to communicate a data pattern into the various flops that form the scan chain 256, while simultaneously reading a stored data value out from the scan chain 256. The length of the scan chain 256 is configurable and limited only by the number of available flops that can be addressed and arranged serially in accordance with the configuration information in the test control registers 254.

FIG. 3 is a schematic diagram illustrating an embodiment of a test environment 300 suitable for performing a soft error rate (SER) test on the device under test 200 of FIG. 1. The test environment 300 increases the rate or flux of ionizing radiation that is incident upon the radiation sensitive memory elements within an ASIC 250 arranged on the device under test 200. As illustrated in FIG. 3, the test environment 300 includes a controller 310, an emitter 320, a sacrificial block 330, a counter 340, and a shield 350. The device under test 200 (e.g., a printed circuit board) is arranged in registration with a proton beam generated by the emitter 320. That is, the printed circuit board, including the ASIC 250, is arranged to intercept ionizing radiation. The device under test 200 can be supported by any mechanical connection. The controller 310 applies one or more control signals via connection 315 under the direction of a test operator to control the rate and or the energy level of the emitted protons. As indicated by the two-way arrows on the connection 315, the controller 310 may receive one or more parameters indicative of the operating condition of the emitter 320.

The proton beam that exits the emitter is directed at a sacrificial block 330. The sacrificial block 330 is constructed of a dense material that releases neutrons as a result of the collisions between the emitted protons in the proton beam and the atoms of the dense material. The released neutrons form a neutron flux field or neutron field that expands as a function of distance from the sacrificial block 330. A counter 340 is arranged to monitor the neutron flux that will pass through the device under test 200 and the ASIC 250. The counter 340 is coupled to the controller 310 by the connection 345, which communicates one or more signals indicative of the neutron flux to the controller 310.

As further illustrated in FIG. 3, the interface device 150 and the power supply 210 are arranged behind a protective barrier 350. The protective barrier 350, which is constructed of one or more dense materials, shields or protects the interface device 150 and the power supply 210 from the ionizing radiation produced by the emitter 320. The protective barrier 350 may be constructed of a single element or may be made from any number of blocks or plates of a dense material that are placed in contact with each other. More blocks, plates, or additional barriers may be added or layered as may be required to prevent the communication of soft errors from the interface device 150 to the ASIC 250. The protective barrier 350 may comprise one or more of concrete, metal, or alloys.

Various power and signal connections (not shown) to the interface device 150 and the power supply 210 may be routed through a port or opening in the test facility to couple the interface device 150 to the computer 110 and to couple the power supply 210 to a power source.

The above described test environment, as illustrated in the embodiments in FIGS. 1 and 3, together with execution of the SER software 400 enables test operators to quantify soft errors that occur in memory elements on a production ASIC. Soft error rates can be determined as a function of one or more of radiation intensity, data value or data pattern, as well as ASIC operating parameters such as voltage and temperature.

Figure 4:
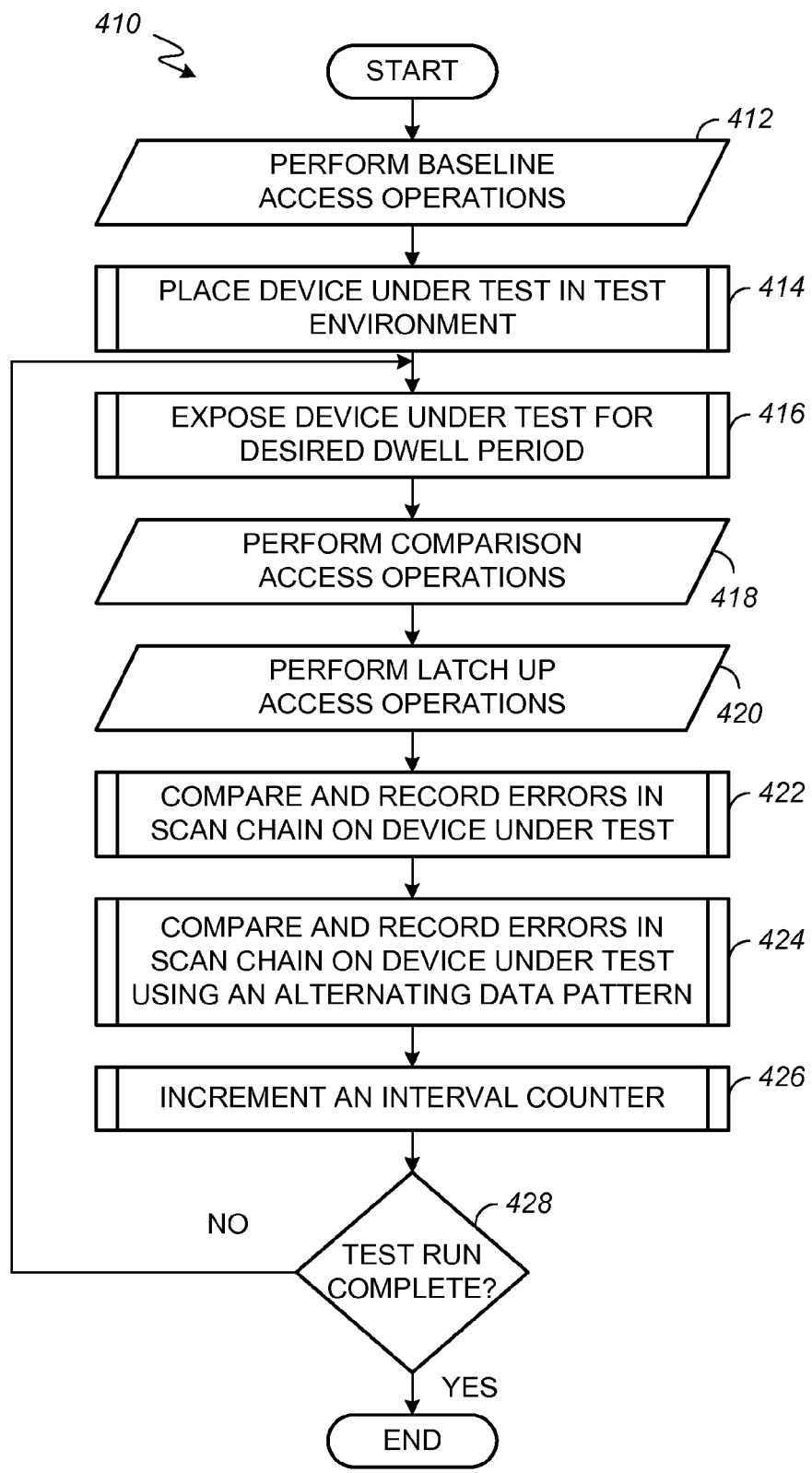
FIG. 4 is a flow chart illustrating an embodiment of a method for measuring soft errors on an ASIC.

FIG. 4 is a flow chart illustrating an embodiment of a method 410 for measuring soft errors in the memory elements of on an ASIC such as the ASIC 250. The flow diagram of FIG. 4 shows the architecture, functionality, and operation of an embodiment of the SER software 400 that quantifies soft errors and soft error rates over time. In this regard, each block represents a module, segment, or portion of code, which comprises one or more executable instructions for implementing the specified function(s).

The method 410 begins with input/output block 412 where a baseline access operation is performed. As described above, a baseline access operation includes writing configuration information to the test control registers 254 to define and/or configure a serial-shift register or scan chain. The baseline access operation further includes the application of a known data pattern into the scan chain 256. Details of an example baseline access operation are described in greater detail in association with the flow diagram of FIG. 5.

In block 414 the device under test 200 is placed in a test environment. As indicated, the test environment may include a specialized test facility such as that provided in the test environment 300 shown in FIG. 3 that is arranged to generate and control ionizing radiation. The device under test 200 (i.e., a printed circuit board with the ASIC 250 mounted thereon) is arranged to intercept the ionizing radiation to induce soft errors in the memory elements on the ASIC 250. A power supply, the interface device, and a computer, configured with the SER software 400, are transported to the test facility and coupled to device under test 200. Alternatively, the test environment may be a bench test arrangement with the device under test 200 and the interface device 150 being coupled to each other with ionizing radiation provided by a portable alpha particle source. It should be understood that the operations and/or functions described in block 412 and block 414 can be performed in any order.

Thereafter, as indicated in block 416, the device under test 200 is exposed to ionizing radiation for a desired dwell period (i.e., a predetermined length of time). As described, the dwell period is determined as a function of the SER neutron cross section $\sigma$, the neutron flux f, the number of errors desired to occur N (for the results to be statistically relevant) and the number of flops susceptible to soft errors B. Once the dwell period has expired, the method 410 continues with input/output block 418 where a comparison access operation is performed. As indicated above, ionizing radiation may be applied during periods of time that overlap the desired dwell period.

As also described above, a comparison access operation includes a check of the content stored in the test control registers. If the data stored in the test control registers does not match the previously communicated configuration information, the data is corrupted and any subsequent data from the scan chain 256 will not be useful. When this is the case, the SER software returns to block 412 where the baseline access operations are repeated. If the SER software returns to block 412 more than a predetermined number of times, the SER software can notify a test operator to remove the ionizing radiation and repeat the baseline access or perform additional tests to identify the nature of the failure. If it is determined that the data in the test control registers 254 is as expected, the SER software continues by shifting an alternating data pattern into the scan chain and storing the read data values (i.e., the data shifted out of the scan chain) into a first results array. Details of an example compare access operation are described in greater detail in association with the flow diagram of FIG. 6.

Next, as indicated in input/output block 420, a latch up access operation is performed. As described above, a latch up access operation includes a check of the content stored in the test control registers 254. When an error is discovered in the test control registers, the SER software performs additional tests to verify a potential latch condition. In an alternative embodiment, the SER software suspends and notifies a test operator to perform the additional steps to verify the latch condition. When an error is discovered in the test control registers, the SER software returns to the first or baseline access operation. Otherwise, when no error is identified in the test control registers, the SER software continues by shifting the original or a new baseline data pattern into the scan chain and storing the read data values into a second results array. Details of an example latch up access operation are described in greater detail in association with the flow diagram of FIG. 7.

In block 422, soft errors in the scan chain are identified and recorded by comparing the written data pattern with the first results array. In addition to maintaining a count of the soft errors, the SER software 400 is configured to record the address of each flop in the scan chain where a soft error is identified (i.e., where the comparison identified a mismatch in the data values).

In block 424, soft errors in the scan chain are identified and recording by comparing the alternating data pattern with the second results array. As described above, an unexpected number of errors such as a number indicating an error rate three or more times greater than expected can be indicative of a latch up condition in one of the flops in the scan chain 256 as the data value in each bit thereafter in the second results array will not change. As also described above, an operator may be notified when a potential latch condition exists as a true latch up condition will require removing power from the ASIC 250 to correct the stuck latch element in the flop.

In block 426, an interval counter is incremented. As explained above, a more efficient use of test facility resources can be achieved by identifying errors in the test control registers early in a test run. This is achieved by dividing the test run into an integer number of intervals. In decision block 428, a comparison is performed to determine if the test run is complete. When the interval counter does not match the number of test intervals, processing continues by returning to block 416 for another dwell period. Otherwise, when the interval counter matches the number of test intervals, a test run is complete.

Figure 5:
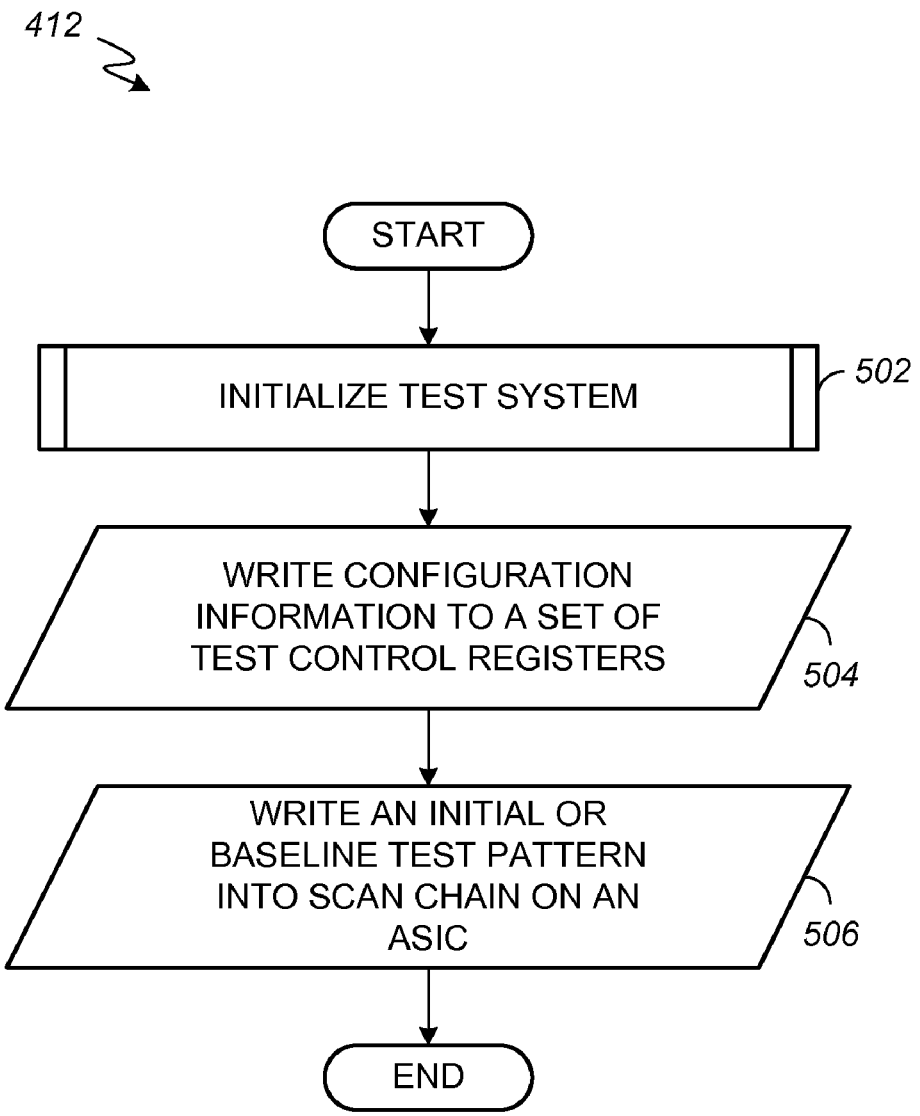
FIG. 5 is a flow diagram illustrating an embodiment of the baseline access operations of FIG. 4.

FIG. 5 is a flow diagram illustrating an embodiment of the baseline access operation 412 of FIG. 4. In block 502, the computer 110, the interface device 150, and the power supply 210 are initialized and prepared for a test run. As a part of this step, one or more pre-tests may be performed to confirm nominal operation of the TAP 252, the test control registers 254, and the core logic 255 of the ASIC 250. The pre-tests will also confirm nominal operation of the computer 110 and the interface device 150. In input/output block 504, configuration information is written to the test control registers 254. As described above, the configuration information identifies and arranges available flops on the ASIC 250 into a serial-shift register or scan chain to test soft errors that occur in such storage elements on the ASIC 250. Once the scan chain has been defined in block 504, an initial or baseline test pattern is shifted into the scan chain 256 as indicated in input/output block 506. Data shifted out of the scan chain during the baseline access operation is ignored.

Figure 6:
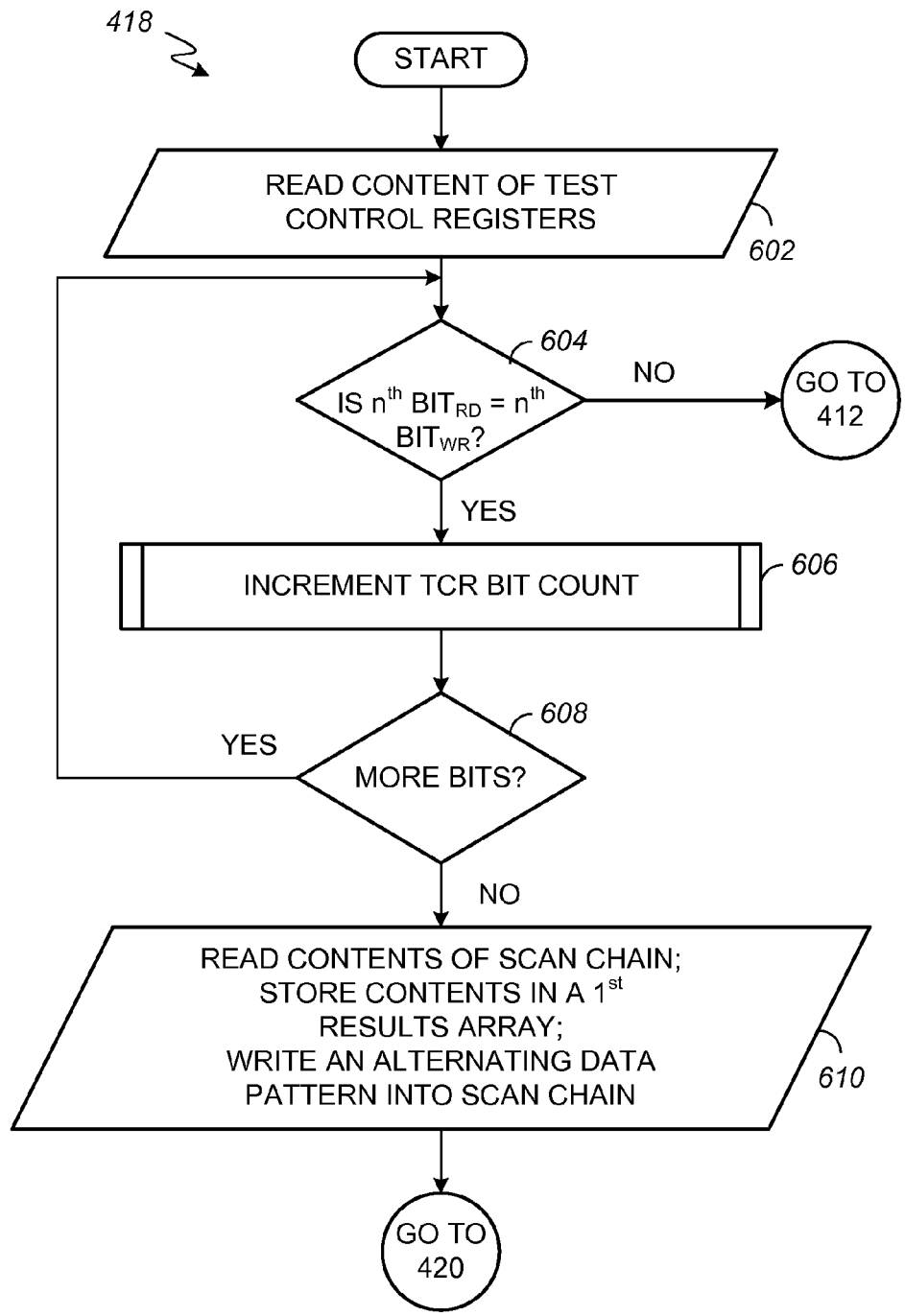
FIG. 6 is a flow diagram illustrating an embodiment of the compare access operations of FIG. 4.

FIG. 6 is a flow diagram illustrating an embodiment of the compare access operation 418 of FIG. 4. In input/output block 602, the content of the test control registers is read. In decision block 604, a comparison is performed of the $n^{th}$ bit read and the $n^{th}$ bit written to the set of control registers 254. When a mismatch is identified, processing continues by returning to block 412 where a baseline access operation is performed. Otherwise, when the data written and read from the $n^{th}$ bit of the set of test control registers 254 is the same, a test control register (TCR) bit count is incremented, as shown in block 606. In decision block 608, it is determined if each bit from the set of test control registers 254 has been processed. When there are more bits to compare, processing returns to decision block 604. When all bits have been processed, the compare access operation continues with input/output block 610, where the contents of the scan chain are read and stored in a first results array while an alternating data pattern is written into the scan chain 256. Once the shift-in and shift-out is complete, processing continues with block 420.

Figure 7:
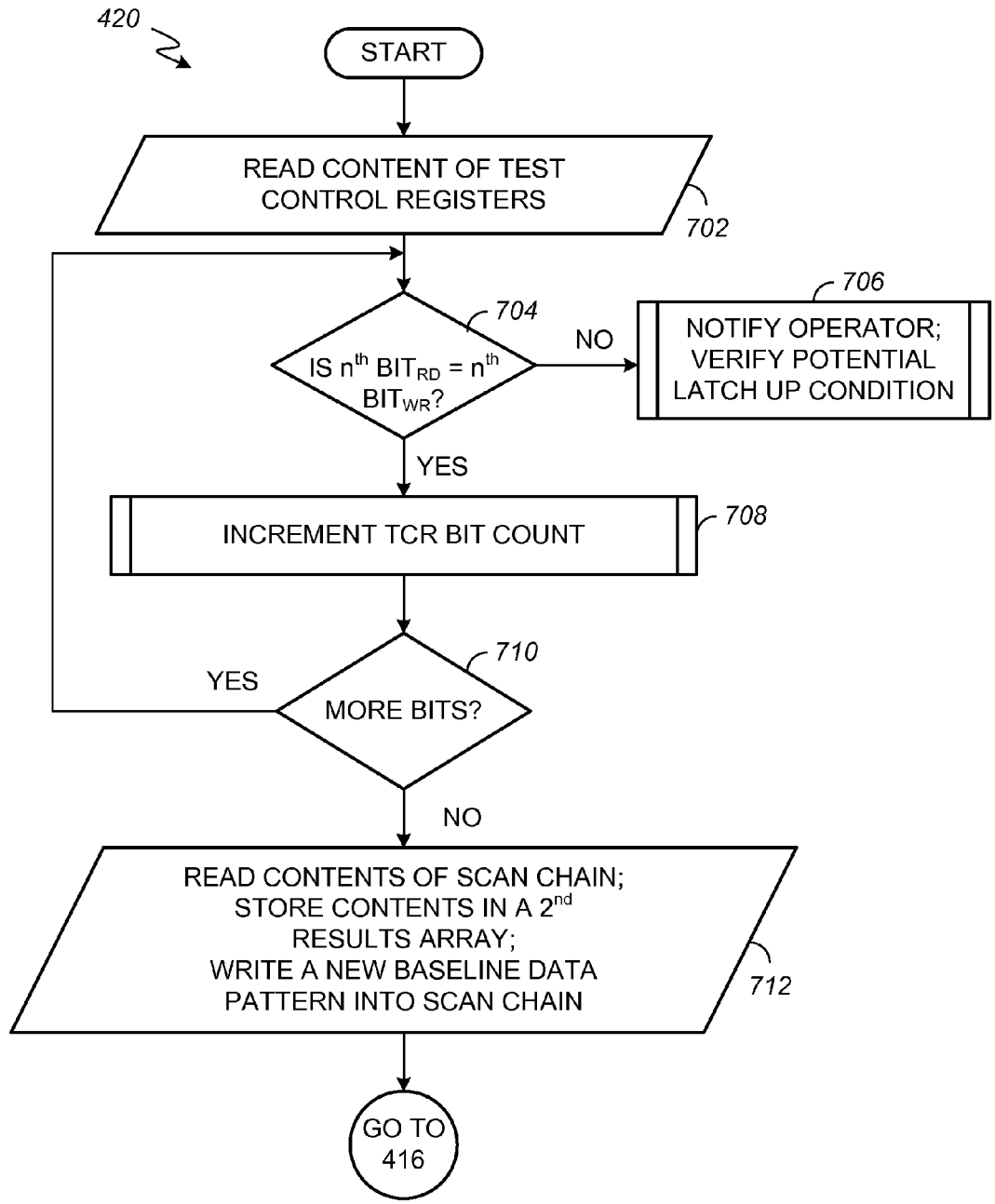
FIG. 7 is a flow diagram illustrating an embodiment of the latch up access operations of FIG. 4.

FIG. 7 is a flow diagram illustrating an embodiment of the latch up access operation 420 of FIG. 4. In input/output block 702, the content of the test control registers is read. In decision block 704, a comparison is performed of the $n^{th}$ bit read and the $n^{th}$ bit written to the set of control registers 254. When a mismatch is identified, processing continues with block 706 where an operator is notified of a potential latch up condition and one or more additional procedures may be performed to verify the condition. Otherwise, when the data written and read from the $n^{th}$ bit of the set of test control registers 254 is the same, a test control register (TCR) bit count is incremented, as shown in block 708. In decision block 710, it is determined if each bit from the set of test control registers 254 has been processed. When there are more bits to compare, processing returns to decision block 704. When all bits have been processed, the compare access operation continues with input/output block 712, where the contents of the scan chain are read and stored in a second results array while a new baseline data pattern is written into the scan chain 256. Data patterns may consist of all "0" logic values, all "1" logic values, or any conceivable pattern. An all "0" data pattern will identify or quantify the susceptibility of the structural elements in the flop associated with storing a logic "0" value to ionizing radiation. Similarly, an all "1" data pattern will identify or quantify the susceptibility of the structural elements in the flop associated with storing a logic "1" value to ionizing radiation. Once the shift-in and shift-out is complete, processing continues with block 416 as described above in association with the method of FIG. 4.

While various example embodiments of the test systems and methods for measuring soft error rates in storage elements on a production ASIC have been described, it will be apparent to those of ordinary skill in the art that many more embodiments and implementations are possible that are within the scope of this disclosure. Accordingly, the described systems and methods for measuring soft error rates are not to be restricted or otherwise limited except in light of the attached claims and their equivalents.

What is claimed is:

1. A test system for quantifying soft errors in storage elements on an application specific integrated circuit (ASIC), the test system comprising:
   a computer having an output port and a memory, the memory containing application software that when executed by the computer quantifies soft errors in storage elements on the ASIC; and
   an interface device having an input port, a translator, and an output port, the input port arranged to receive commands and data from the output port of the computer, the translator configured to modify the commands and data from a first protocol to a second protocol, the output port of the interface device coupled to a device under test and communicating the commands and data in the second protocol.

2. The test system of claim 1, further comprising an emitter and a controller, the emitter coupled to the controller and configured to generate and direct a neutron flux through the ASIC, the emitter operating under the direction of the controller.

3. The test system of claim 2, further comprising a counter arranged in registration with the ASIC and the emitter, the counter arranged to provide a measure of the neutron flux.

4. The test system of claim 3, wherein the counter provides a measure of the neutron flux to the controller.

5. The test system of claim 1, wherein the output port on the computer is one of a parallel communication port and a universal serial bus (USB) port.

6. The test system of claim 5, wherein when the output port on the computer is a USB port, the system further comprises a converter that converts USB compatible signals from the USB port for transmission along an ANSI/TIA/EIA-568-A/B compliant cable to the interface device.

7. The test system of claim 1, further comprising an adjustable power supply coupled to the ASIC.

8. The test system of claim 1, further comprising a temperature sensor associated with the ASIC and a control system coupled to the temperature sensor, the control system configured to controllably adjust a temperature measured by the temperature sensor.

9. The test system of claim 1, wherein the application software detects communication errors between the computer and the ASIC.

10. The test system of claim 1, wherein the application software detects a single event latch in a scan chain on the ASIC.

11. The test system of claim 10, wherein the application software detects and records a number of soft errors in the scan chain.

12. The test system of claim 1, wherein the interface device communicates with a scan chain on the ASIC via a test access port and a set of test control registers.

13. The test system of claim 12, wherein the application software detects errors in the set of test control registers.

14. The test system of claim 1, wherein the application software manages access to a scan chain comprising more flops than the data capacity of the interface device.

15. A method for measuring soft errors in an application specific integrated circuit (ASIC), the method comprising:
   accessing a scan chain on the ASIC to write initial data into the individual storage elements within the scan chain, wherein accessing comprises writing a first data pattern into a set of test control registers and writing a second data pattern into the individual storage elements of the scan chain;
   arranging the ASIC in registration with an emitter configured to generate and direct a neutron flux in the direction of the ASIC;
   exposing the ASIC to the neutron flux to trigger a soft error in one or more storage elements within the scan chain;
   accessing the contents of the set of control registers and comparing read data values to the first data pattern, when the comparing results in an indication that the read data values do not match the first data pattern, ignoring data from the individual storage elements of the scan chain, when the comparing indicates that read data values match the first data pattern, storing the contents of the individual storage elements of the scan chain in a first array while writing an alternating data pattern into the individual storage elements of the scan chain;

accessing the contents of the set of control registers and comparing read data values to the first data pattern, when the comparing results in an indication that the read data values do not match the first data pattern, verifying a latch condition, when the comparing indicates that read data values match the first data pattern, storing the contents of the individual storage elements of the scan chain in a second array while writing a new baseline data pattern into the individual storage elements of the scan chain;

comparing the second data pattern with the contents of the first array; and comparing the alternating data pattern with the contents of the second array.

16. The method of claim 15, wherein comparing the second data pattern with the contents of the first array further comprises counting soft errors.

17. The method of claim 15, wherein comparing the alternating data pattern with the contents of the second array comprises determining if the number of errors is greater than a threshold number.

18. The method of claim 17, wherein when a result of the determining indicates that the number of detected errors is greater than the threshold number, performing successive access operations to confirm a latch up error.

19. The method of claim 18, wherein when a latch up error is confirmed, cycling power on the ASIC and performing successive access operations to correct the latch up error.

20. The method of claim 15, wherein one of supply voltage, data pattern, and operating temperature are varied while the remaining two variables are held constant.

* * * * *